United States Patent
Cox et al.

(10) Patent No.: US 6,221,535 B1
(45) Date of Patent: Apr. 24, 2001

(54) PHOTOREFRACTIVE COMPOSITE

(75) Inventors: Alan M. Cox, Manchester; Richard D. Blackburn, Derby; Frances A. Wade, Middlesex; David P. West, Wigan; Terence A. King, Cheadle Hulme; David Leigh, Cheshire, all of (GB)

(73) Assignee: The Victoria University of Manchester, Manchester (GB)

(*) Notice: Subject to any disclaimer, the term of this patent is extended or adjusted under 35 U.S.C. 154(b) by 0 days.

(21) Appl. No.: 09/180,402

(22) PCT Filed: May 12, 1998

(86) PCT No.: PCT/GB97/01295

§ 371 Date: Jan. 11, 1999

§ 102(e) Date: Jan. 11, 1999

(87) PCT Pub. No.: WO97/43759

PCT Pub. Date: Nov. 20, 1997

(30) Foreign Application Priority Data

May 11, 1996 (GB) .................................................. 9609876
Jul. 10, 1996 (GB) .................................................. 9614505

(51) Int. Cl.$^7$ .......................... G03H 1/04; C07C 245/00; C09B 56/02
(52) U.S. Cl. .................................. 430/1; 430/290; 430/1; 359/3; 534/573; 534/738
(58) Field of Search .......................... 430/1, 2, 290; 359/3; 534/573, 558, 738

(56) References Cited

U.S. PATENT DOCUMENTS

| | | | |
|---|---|---|---|
| 4,981,612 | * 1/1991 | Allen et al. ........................... | 534/573 |
| 5,039,186 | * 8/1991 | Man et al. ............................ | 385/122 |
| 5,185,208 | 2/1993 | Yamashita et al. ................ | 428/411.1 |
| 5,361,148 | * 11/1994 | Bjorklund et al. ...................... | 359/3 |
| 5,460,907 | * 10/1995 | Ducharme et al. ..................... | 430/1 |
| 5,607,799 | * 3/1997 | Moerner et al. ........................ | 430/1 |
| 5,744,267 | * 4/1998 | Meerholz et al. ....................... | 430/1 |

FOREIGN PATENT DOCUMENTS 2 255 336    11/1992  (GB) .

OTHER PUBLICATIONS

Lundquist, P.M. et al., Organic Glasses: A new class of photorefractive materials Science vol. 274, pp. 1182–1185, Nov. 1996.*

Nature, vol. 371, Oct. 6. 1994, London GB, pp. 497–500, XP002040316 Meerholzen K et al: "A photorefractive polymer with high optical gain and diffraction efficiency near 100%" cited in the application see the whole document.

Electronics Letters, vol. 29, No. 21, Oct. 14, 1993, Stevanage GB, p. 1873/1874 XP000404324 Kippelen B et al: "New Highly Efficient Photorefractive Polymer Composite for Optical–Storage and Image–Processing Applications" cited in the application see the whole document.

Applied Physics Letters, vol. 68, No. 20, May 13, 1996, New York US, pp. 2801–2803, XP002040317 Cox A M et al: "Crystallization–resistant photorefractive plymer composite with high diffraction efficiency and reproducibility" see the whole document.

\* cited by examiner

*Primary Examiner*—Martin Angebranndt
(74) *Attorney, Agent, or Firm*—Nixon & Vanderhye

(57) ABSTRACT

A photorefractive composite comprises a charge transport matrix and an electrooptic dye having an aliphatic group of four or more carbon atoms.

15 Claims, 3 Drawing Sheets

PHOTOREFRACTIVE COMPOSITE

BACKGROUND OF THE INVENTION

The present invention relates to a photorefractive composite.

Photorefractive composites are potentially useful in the production of holograms for optical processing and information storage. For a review of such composites see the article by W. E. Moerner in Nature, Vol 371, pages 475 et seq (October 1994).

The photorefractive effect was first observed in inorganic materials, e.g. barium, titanate and lithium niobate. Since the demonstration of the first organic polymer based photorefractive (PR) system in 1991 [1], this class of materials has been developed to a point where they have now equalled or surpassed [2,3] many of the performance characteristics of both organic and inorganic PR crystals. Together with the low cost and versatility of organic polymer based systems this makes them highly attractive for commercial applications in optical data storage and optical data processing. Recently a PR polymer has been shown to exhibit 86% steady state diffraction efficiency [2], an outstanding increase over earlier systems, moving PR polymers further toward implementation. This composite comprises a PVK:TNF charge-transport network (which has been known for a long time and is used in photocopiers), an electro-optic polar dye (DMNPAA) and a material to lower the resulting composite viscosity at room temperature (a plasticiser) ECZ. The structures of TNF, PVK, ECZ and DMNPAA are shown below. In this prior composition, the ECZ (16% by weight) allows the re-orientation of the dye molecule at room temperature due to the lowering of the glass transition temperature (Tg), but is otherwise inert as far as the photorefractive process is concerned. This inert substance is unwanted if it is desired to achieve the highest concentration of all the active components. Several groups, however, have reported this to be a capricious and unstable system [4-6] which suffers from non-trivial sample preparation, stringent storage requirements (low humidity and dust free environment), and a risk of short device lifetimes. This system has since been reported by many groups to be extremely difficult to synthesise with good optical quality due to the crystallisation of the dye (DMNPAA) from the matrix.

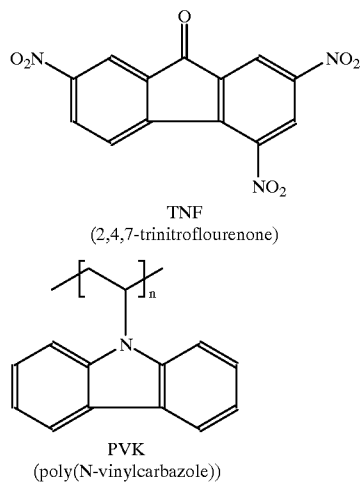

TNF
(2,4,7-trinitroflourenone)

PVK
(poly(N-vinylcarbazole))

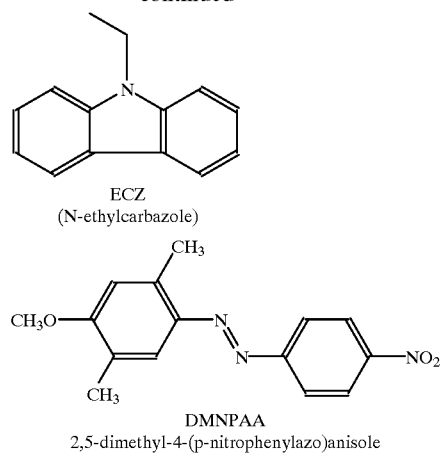

ECZ
(N-ethylcarbazole)

DMNPAA
2,5-dimethyl-4-(p-nitrophenylazo)anisole

DESCRIPTION OF THE INVENTION

According to a first aspect of the present invention there is provided a photorefractive composition comprising a charge transport matrix and an electrooptic dye having an aliphatic group of four or more carbon atoms.

By using an electrooptic dye containing a aliphatic group of four or more carbon atoms, the dye becomes less polar per unit length and hence more soluble in a non-polar charge transport host. This allows the incorporation of higher concentrations of the dye into the host matrix without crystallisation problems and, subsequently, the composite is very easy to fabricate without specialised conditions. Another advantage is that the dyes reduce the glass transition temperature of the resulting matrix itself and there is no need for an additional plasticiser such as ECZ in order for the re-orientational effect to be present. This allows all of the composite to be active in the photorefractive process.

The dye preferably incorporates an unsubstituted alkyl group. Preferably the group is branched. This alkyl group may have 4 or more carbon atoms and may for example be a sec-butyl or t-butyl group but more preferably has a larger number of carbon atoms. For preference the alkyl group has at least 5 and more preferably at least 8 carbon atoms. A particularly preferred alkyl group is the 2-ethythexyl group. A further example is the 3-methylbutyl group.

Generally the alkyl group will not have more than 30 carbon atoms. A preferred maximum is 20.

The electrooptic compound may be an azo compound or a stilbene compound.

The electrooptic dye may for example by of the formula I

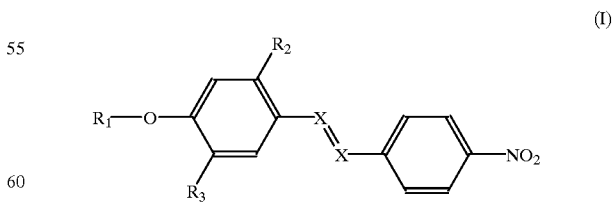

(I)

where $R_1$ is an alkyl group of at least 4 carbon atoms, $R_2$ and $R_3$ are the same or different and are alkyl groups having up to 3 carbon atoms, X is carbon or nitrogen.

Such compounds are novel and provide a second aspect of the invention.

Preferably R₁ is branched and preferably has at least 5 carbon atoms. For preference R₁ is 2-ethylhexyl. A further favoured option for R₁ is 3-methylbutyl.

R₂ and R₃ are preferably methyl.

X is preferably nitrogen.

The compound in which R₁=2-ethylhexyl, R₂=R₃=methyl, and X=Y=nitrogen is represented by formula (II) below and is a preferred embodiment of the second aspect of the invention.

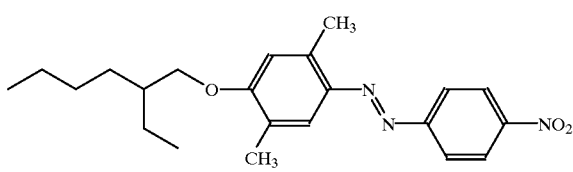

(II)

The systematic name of (II) is 1-(2'-ethylhexyloxy)-2,5-dimethyl-4-(4''-nitrophenylazo)benzene and it is referred to herein as EHDNPB.

The charge transport matrix for use in the composition of the first aspect of the invention preferably comprises PVK as a conductive matrix and a charge sensitising agent. This charge sensitising agent may for example be TNF. Alternative charge sensitising agents are $C_{60}$, $C_{70}$ and 2,4,7,9-tetranitrofluorenone (TeNF) (for use in the presence of oxygen). The presence of charge carrier trap sites can be of importance. Maximum hologram spatial frequency, stability under readout illumination and dark stability are strongly dependent on the properties of charge carrier trap sites. The traps must be deep enough to inhibit thermal liberation processes and under readout conditions of illumination and poling field optical libation from the traps should ideally also be suppressed. The intrinsic trap density can be reduced by preparation of materials and sample fabrication in a nitrogen atmosphere. Deep and complex trap systems may be introduced by the addition of higher doping levels of fullerene $C_{60}$, ultraviolet irradiation, and thermal decomposition.

Alternative charge transfer matrices (photoconductive matrices) which may be used are poly(methylphenyl silane) (PMPSi) and poly(p-phenylenevinylene) (PPV) derivatives such as poly[1,4-phenylene-1,2-diphenoxyphenylvinylene] (DPOP-PPV). A further possibility is poly (epoxypropylcarbazole) (PEPC). Such charge transfer matrices may not require the use of charge sensitising agents but they can be added.

The amount of the electrooptic dye incorporated in the composition of the first aspect of the invention may for example be 10 to 70% by weight of the composition, more preferably 40 to 60% by weight on the same basis.

The preferred matrix is PVK:TNF. The PVK:TNF ratio may for example be (40–50:1).

Preferred polymer composites of this invention are based PVK:TNF and which include an electro-optic chromophore. This chromophore incorporates a racemic ethylhexyl group. This non-polar functionality has two important roles. Firstly, it renders the dye a plasticiser and as such activates the orientational enhancement mechanism [7]. Secondly, it increases the solubility of the dye in PVK inhibiting crystallisation. The resulting composite reproducibly forms stable, optically transparent films with good reorientational mobility. No separate plasticising agent such as N-ethylcarbazole (ECZ) [2], is required.

As indicated above, compositions in accordance with the first aspect of the invention are easy to fabricate and do not require the incorporation of ECZ. The devices made from such compositions also have a relatively long device lifetime. Thus, by way of example, we have fabricated devices containing 55% of EHDNPB in a PVK:TNF host and such devices had a lifetime exceeding 8 months without special storage conditions. By comparison, we were only able to introduce 10% DMNPAA into the PVK:TNF host without crystallisation occurring within a matter of days.

We have been able to produce a high optical quality, long-life guest-host photorefractive polymer composite which exhibits a 60% device steady state diffraction efficiency and 120 cm⁻¹ two-beam coupling gain, well in excess of its absorption of 3.5 cm⁻¹, at a wavelength of 676 nm. In contrast to alternative composite materials of comparable high dye content, this performance has been achieved without unacceptably compromising device lifetime or ease of fabrication and storage. This is an efficient, easily prepared and comparatively stable polymer composite with device lifetimes under storage conditions already exceeding 8 months and no indication of sample degradation with repeated holographic read-write cycles.

BRIEF DESCRIPTION OF THE DRAWINGS

The invention will be further described with reference to the following non-limiting Example and accompanying drawings (illustrating results of the Example) in which.

EXAMPLE

Figure 1:
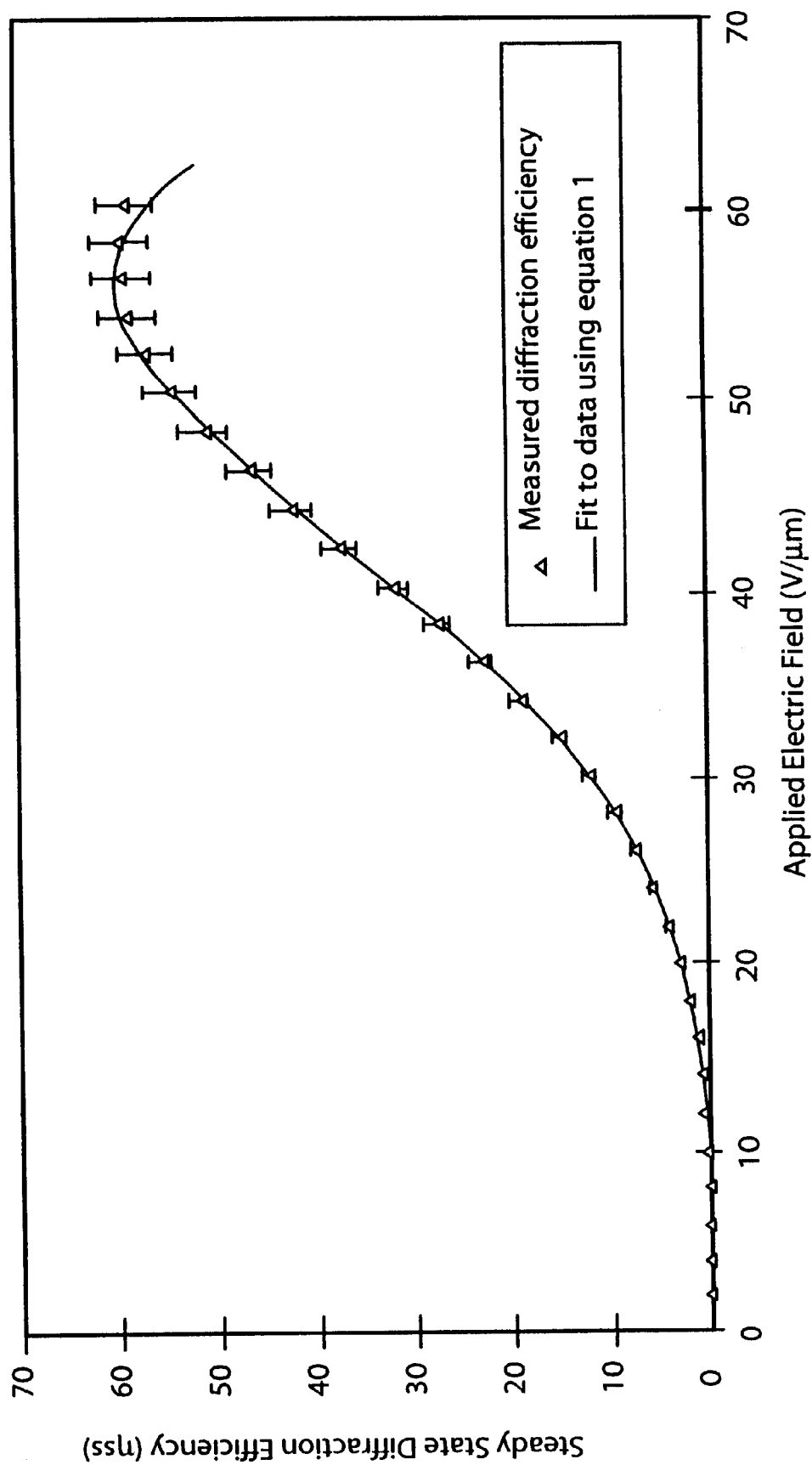
FIG. 1 shows steady state diffraction efficiency ($\eta_{ss}$) from a 250 μm sample as a function of applied field (poling field) with fit from coupled wave theory model.

EHDNPB was prepared by first synthesising 2,5-dimethyl-4-(p-nitrophenylazo)phenol by the diazonium coupling of p-nitroaniline and 2,5-dimethylphenol. The ethylhexyl group was then introduced by alkylation of the phenol using 2-ethylhexylbromide, to produce EHDNPB. This dye was purified using column chromatography, as was the TNF (from Apin Chemicals). Secondary standard PVK (from Aldrich Chemical Company) was purified by precipitation (dropwise addition of a 15 wt % solution of PVK in toluene to boiling ethanol). Solutions of the composite were then prepared by mixing the constituents in the required ratios using dichloromethane (DCM) as the solvent. The high solubility of EHDNPB in PVK meant that up to 55% wt of the dye could be readily incorporated in the polymer matrix without the need to resort to ultrapure reagents or solvents, or clean rooms and humidity controls[8]. This composite of low glass transition temperature (comparable to room temperature) produced devices that were both crystallite-free and of good optical quality. We report here on the results of photorefractive characterisation of a composite consisting of EHDNPB:PVK:TNF in a weight ratio 55:44:1 respectively.

To prepare devices, the polymer composite was placed onto two etched indium tin oxide (ITO) coated glass slides and dried in an oven at 120° C. for 15 hours to remove all of the solvent. The plates were then pressed together whilst separated by spacers. The spacers ensured a definite and constant thickness of 250 μm whilst the adhesion of the polymer composite was sufficient to hold the device together. Care was taken to ensure that no air bubbles were trapped inside. Air has a relatively low dielectric strength and electrical discharge causes catastrophic damage to the device. The dielectric strength of the polymer composite is observed to be at least an order of magnitude higher than that of air. Early devices fabricated in excess of 8 months previously are still optically clear and functional.

Degenerate four wave mixing [9] was used to determine the steady state diffraction efficiency of the polymer composite, using the 676 nm line of a krypton ion laser. In these experiments, 10 mW/cm² writing beams were used, intersecting at 20° with their bisector at 65° from the sample normal. The probe beam was p-polarised and of significantly lower intensity (0.1 mW/cm²) in order to avoid parasitic grating formation and grating erasure. The writing beams were s-polarised (perpendicular to the poling field) to minimise two-beam coupling effects.

The maximum applied field was 15 kV DC. At higher DC fields, breakdown sometimes occurred around the sample between the ITO strips. Breakdown of the polymer is seldom observed. An external steady state device diffraction efficiency ($\eta_{ss}$) of 60% was achieved near this maximum applied voltage as in FIG. 1. The fit to the data in FIG. 1 assumes that the refractive index ($\Delta n$) varies as the square of the applied field ($E_{app}$). This is due to the applied voltage influencing both the orientation of the electro-optic dye and the space-charge field within the composite. It is assumed here that neither of these are near saturation.

Kogelnik's coupled wave model [10] predicts that the diffraction efficiency ($\eta$) of a volume transmission holograms should be proportional to $\sin^2$ ($\Delta n$) so the fit to the data used in FIG. 1 is of the form $$\eta = K.\sin^2(E^2 app), \qquad \{1\}$$

where the constant of proportionality, K, is less that unity due to absorption losses, Fresnel losses and any deviation from the Bragg condition.

Also, by study of the zero and first order diffracted beam intensities, we calculate that the internal diffraction efficiency ($\eta_{int}$), neglecting Fresnel and absorption losses, to be in excess of 95% using $$\eta_{int} \approx \frac{I_1}{I_1 + I_0}, \qquad \{2\}$$

where $I_0$ is the intensity of the zero order diffracted probe beam, and $I_1$ is the intensity of the first order diffracted probe beam. This equation assumes that both beams are subject to similar losses within the device.

The configuration used is not optimised in terms of Fresnel transmission losses. The Fresnel losses can be reduced significantly by use of anti-reflection coatings on the glass surfaces, however a 60% device efficiency has been reported as sufficient for many commercial applications [11].

The rise time of the photorefractive hologram was both poling field and optical intensity dependent. In the configuration used, more than one time constant was observed. 60% of the maximum steady state diffraction efficiency was achieved in less than a second. Several seconds, however, were needed in order to achieve the maximum efficiency. The half-life of the hologram in the dark was measured to be over 4 hours.

Figure 2:
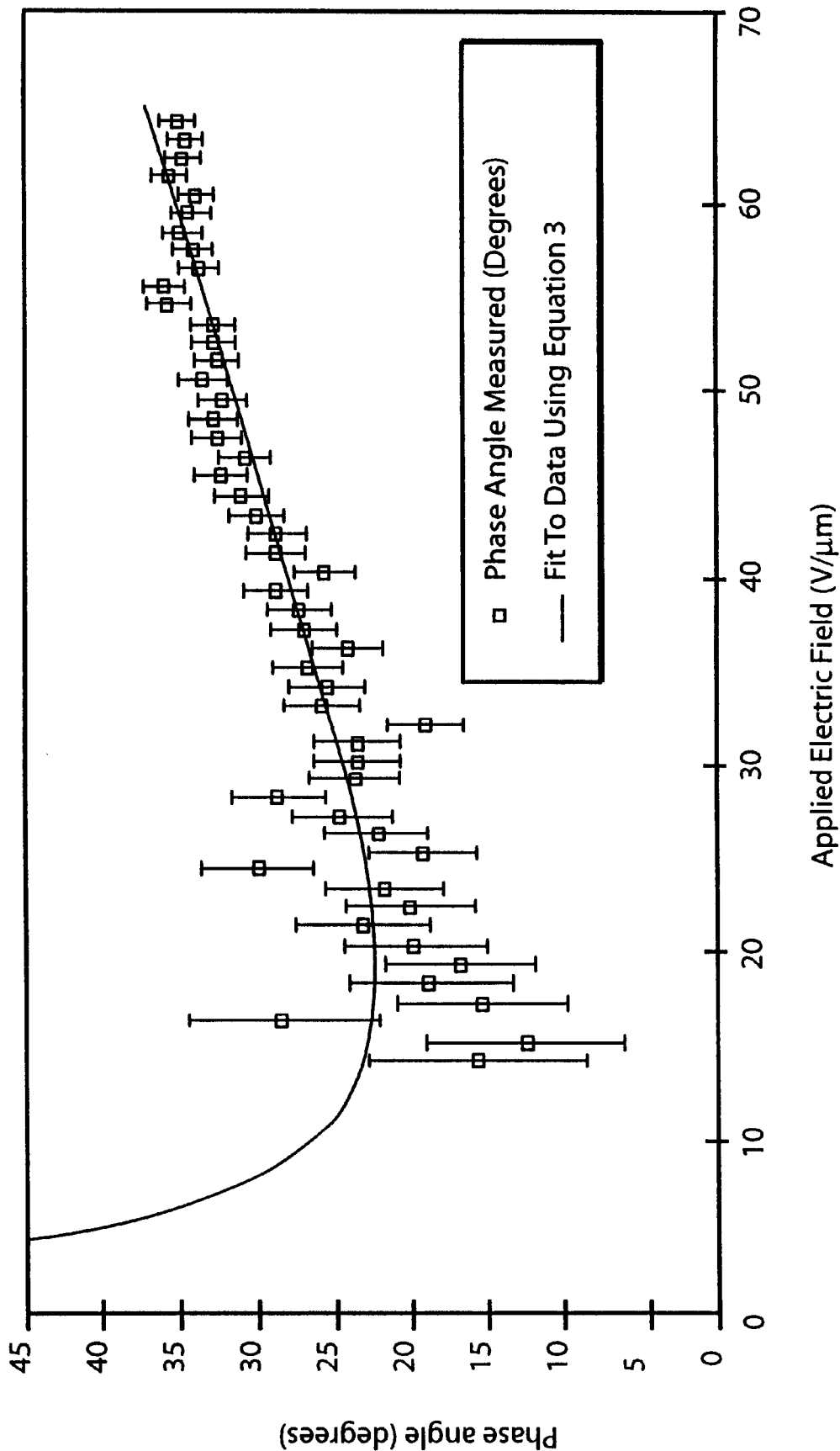
FIG. 2 shows variation of device grating phase with applied electric field with fit from standard photorefractive grating phase model.

To prove conclusively that the hologram written into the composite is photorefractive in nature, asymmetric two-beam coupling [2BC] grating phase measurements [12] were performed using p-polarised writing beams. Firstly, the photorefractive grating was written and allowed to reach a steady state. In this stationary state, the efficiency of asymmetric 2BC was measured. Next the writing optical interference pattern was quickly (on a time scale short when compared to the grating rise time of a few hundred milliseconds) translated by more than one period. The intensities of both exit beams from the sample were monitored. Maximum 2BC coupling occurs for an intensity distribution 90° out of phase with the index grating written by it. This corresponds to the maximum amplitude observed during grating translation, and by comparing this to the asymmetric stationary beam coupling, it is possible to measure the phase of the stationary photorefractive grating with respect to the optical intensity pattern. The dependence of the grating phase on applied poling field is compared to the predictions of the standard model of photorefractivity [12] in FIG. 2 given by $$\text{Grating phase} = \text{Phase}\left[\frac{E_{g,dc} + iE_d}{1 + E_d/E_q - iE_{g,dc}/E_q}\right], \qquad \{3\}$$

where $E_{g\ de}$ is the component of the applied electric field along the grating wave vector, $E_d$ is the diffusion field and $E_q$ is the trap limited space-charge field. Using the fit of equation 3 to FIG. 2, we estimate that $E_d$=3.1V/$\mu$m and $E_q$=78V/$\mu$m.

These observations suggest that in the range of 12V/$\mu$m to 65V/$\mu$m charge carrier motion is neither diffusion or drift dominated (low and high limits respectively). The standard model of photorefractivity is applied to inorganic crystals and suggests that in the limiting cases of low or high applied fields grating phase is near to 90°. In these regimes charge carrier motion is dominated by either diffusion or drift respectively. In polymers, charge carrier photo-generation efficiency is a strong function of electric-field. This results in very low quantum efficiency of charge carrier generation at low-fields and hence only a small photorefractive response. At electric fields of less than 12V/$\mu$m, the index grating is too weak to enable us to accurately measure its phase.

In the configuration shown, we were able to measure a 2BC gain coefficient of over 120 cm$^{-1}$, whilst the device absorption was only 3.5 cm$^{-1}$, enabling an almost complete coupling of one writing beam into the other. On changing the polarisation of the writing beams from p to s polarised, the beam coupling was reversed. This is evidence that orientational enhancement is playing an important role in the response of this polymer [12].

Figure 3:
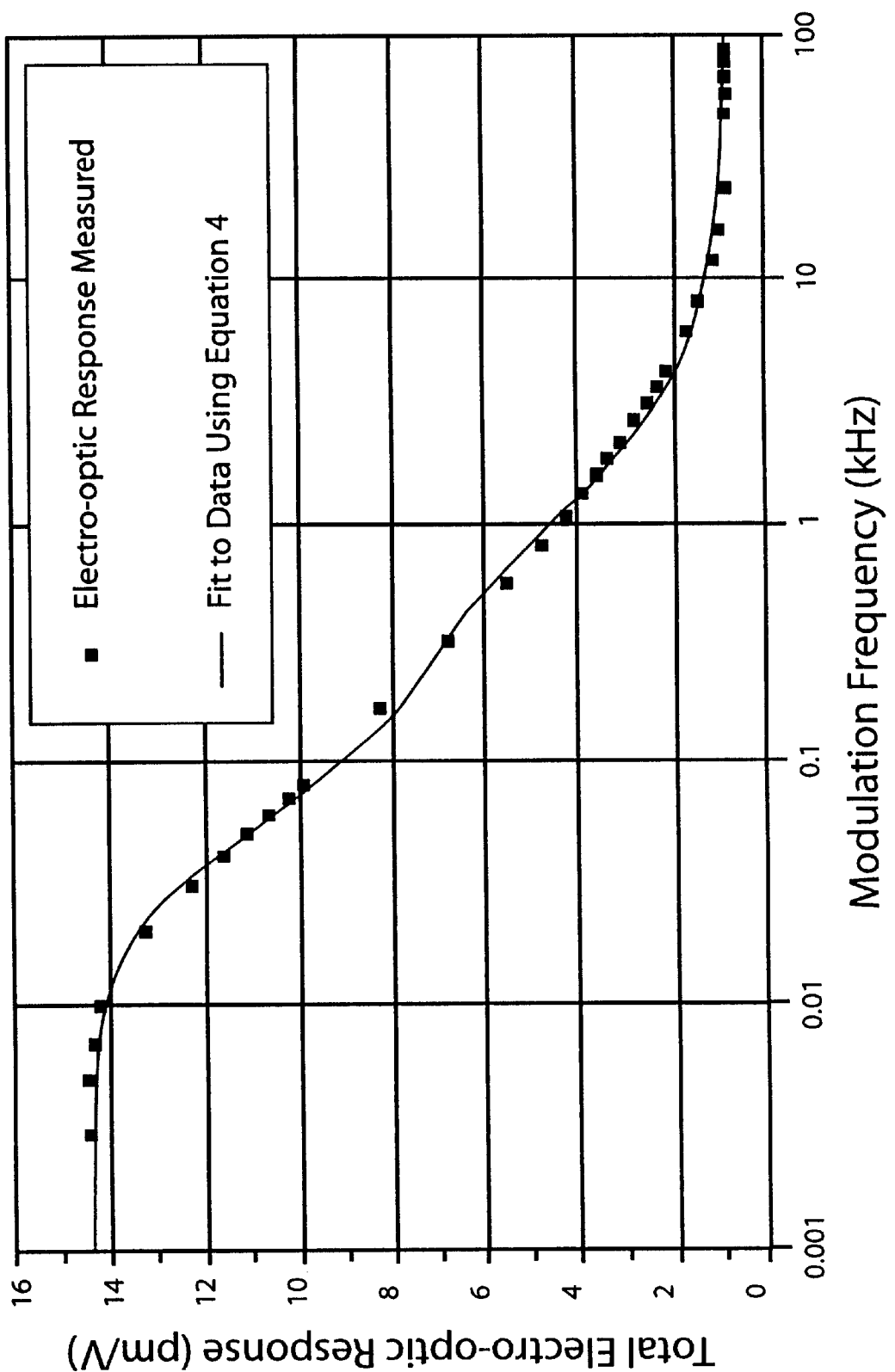
FIG. 3 shows total electro-optic response ($n^3 r_{13}$) as a function of modulation frequency using a Mach-Zehnder interferometer.

The response of the simple electro-optic (Pockets) effect is significant at optical frequencies whilst the orientational effect responds on a time-scale on the order of a millisecond. FIG. 3 shows the frequency dependence of the electro-optic response $n^3 r_{13}$ measured by Mach-Zehnder interferometry. At high frequencies the orientational effect is insignificant and only the simple electro-optic effect is observed. At low frequencies both effects contribute to the $r_{13}$ coefficient. The electric field applied across the polymer during these measurements was only 23 V/$\mu$m and the estimated error in each measurement is ±7%.

At least two distinct time constants and a component independent of frequency can be identified in the electro-optic response. The fit used in the frequency domain is of the form $$n^3 r_{13}(f) = Elec + \frac{Orient_1}{\sqrt{(2\pi f \tau_1)^2 + 1}} + \frac{Orient_2}{\sqrt{(2\pi f \tau_2)^2 + 1}}, \quad \{4\}$$

where f is the modulation frequency and n is the refractive index. Elec represents the simple (electronic) electro-optic response, found to be 0.9 pm/V. $Orient_1$ (5.4 pm/V) and $Orient_2$ (8.1 pm/V) represents the change in electro-optic response due to the reorientational effect. Time constants of $\tau_1$=0.20 ms and $\tau_2$=4.29 ms respectively are observed. The bulk of the quasi-steady-state electro-optic response (low frequency regime) is due to the re-orientation of chromophores (a total of 13.5 pm/V) with a contribution of 0.9 pm/V due to the simple electro-optic effect. The presence of two time constants appears to be consistent with the existence of two different reorientational mobilities of the chromophore about its long axis and perpendicular to this axis. This is possibly due to the lack of cylindrical symmetry about the long axis of the chromophore index ellipsoid.

In summary, we have demonstrated a PR polymer composite of good optical quality which has extended device lifetime, 60% device diffraction efficiency at 676 nm and 120 cm$^{-1}$ two-beam coupling gain. The lifetime, reproducibility and ease of manufacture of this composite offer significant advantages over present alternative composites of comparable efficiency.

REFERENCES

1. S. Ducharme, J. C. Scott, R. J. Twieg and W. E. Moerner, Phys. Rev. Lett. 66, 1846 (1991).
2. K. Meerholz, B. L. Volodin, Sandalphon, B. Kippelen and N. Peyghambarian, Nature, 371,497 (1994).
3. B. Kippelen, Sandalphon, N. Peyghambarian, S. R. Lyon, A. B. Padias and H. K. Hall Jr., Electronic. Lett. 29, 1873 (1993).
4. W. E. Moerner, C. Poga, Y. Jia and R. J. Tweig, Organic Thin Films for Photonics Applications (OSA Technical Digest Series), 21, 331 (1995).
5. C. Poga, R. J. Twieg and W. E. Moerner. Organic Thin Films for Photonics Applications (OSA Technical Digest Series), 21,342 (1995).
6. B. G. Levi, Physics Today, 48,1, 17 (1 995).
7. W. E. Moerner, S. M. Silence, F. Hache and G. C. Bjorklund, J. Opt. Soc. Am. B, 11, 320 (1994).
8. In contrast, under our laboratory conditions even 10% wt DMNPAA (see ref [2]) incorporation was rapidly followed by crystallite formation.
9. J. Feinberg, *Optical Phase Conjugation*, Chapter 11, Academic Press Inc. New York (1983).
10. H,. Kogelnik, Bell System Tech. J, 48, 2909 (1969).
11. R. Dagani, Chemistry and Engineering News, 28, Feb. 2, 1995.
12. C. A. Walsh and W. E. Moerner, J. Opt. Soc. Am. B, 9, 1642 (1992).

What is claimed is:

1. A photorefractive composite comprising a charge transport matrix and an electrooptic dye which has an aliphatic group of 8 or more carbon atoms and which plasticises the matrix without the need for a separate plasticiser, said aliphatic group having a branch of at least two carbon atoms.

2. A composition as claimed in claim 1 wherein the aliphatic group of the dye is an unsubstituted alkyl group.

3. A composite as claimed in claim 1 wherein the alkyl group is the 2-ethyl hexyl group.

4. A composite as claimed in claim 1 wherein the electrooptic dye is of the formula I

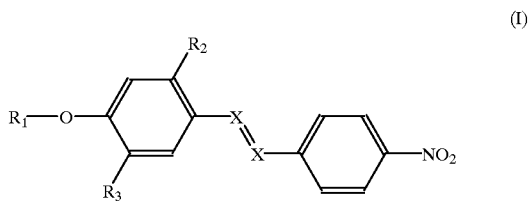

(I)

where $R_1$ is an alkyl group of at least 4 carbon atoms, $R_2$ and $R_3$ are the same or different and are alkyl groups having up to 3 carbon atoms, and X is carbon or nitrogen.

5. A composite as claimed in claim 4 wherein the electrooptic compound is 1-(2'-ethylhexyloxy)-2,5-dimethyl-4-(4"-nitrophenylazo) benzene.

6. A composite as claimed in claim 1 comprising poly(N-vinylcarbazole) as a conductive matrix and a charge sensitizing agent therefor.

7. A composite as claimed in claim 6 wherein the charge sensitising agent is 2,4,7-trinitrofluorenone.

8. A composite as claimed in claim 7 wherein the charge sensitising agent is $C_{60}$, $C_{70}$, or 2,4,7-trinitrofluorenone.

9. A composite as claimed in claim 1 wherein the charge transfer matrix is poly(methylphenyl silane) or a poly(p-phenylenevinylene) derivative selected from the group consisting of poly(p-phenylenevinylene) and poly [1,4-phenylene-1,2-diphenoxyphenvlvinylene].

10. A composite as claimed in claim 9 wherein the charge transfer matrix is poly[1,4-phenylene-1,2-diphenoxyphenylvinylene].

11. A composite as claimed in claim 1 comprising 10 to 70% by weight of the electrooptic dye.

12. A composite as claimed in claim 11 comprising 40 to 60% by weight of the electrooptic dye.

13. A composite as claimed in claim 1 wherein the electrooptic compound is an azo compound or a stilbene compound.

14. A compound of the formula I

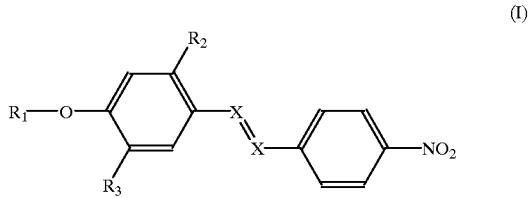

(I)

where $R_1$ is an alkyl group of at least 8 carbon atoms having a branch of at least two carbon atoms, $R_2$ and $R_3$ are the same or different and are alkyl groups having up to 3 carbon atoms, and X is carbon or nitrogen.

15. A compound as claimed in claim 14 which is of the formula II

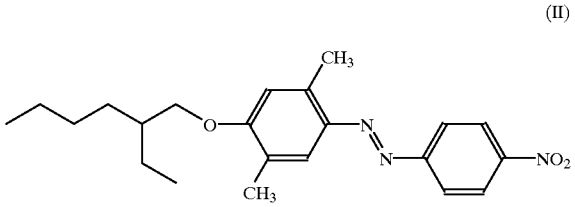

(II)

* * * * *